United States Patent [19]

Forster et al.

[11] 3,962,608

[45] June 8, 1976

[54] APPARATUS FOR HOLDING AND COOLING ELECTRONIC CIRCUIT BOARDS IN REMOTE-CONTROLLED TYPEWRITERS

[75] Inventors: Franz Forster, Landshut; Paul Bauer, Ergolding, both of Germany

[73] Assignee: Forster Electronic GmbH, Landshut-Ergolding, Germany

[22] Filed: July 1, 1974

[21] Appl. No.: 484,711

[30] Foreign Application Priority Data

July 13, 1973 Germany ........................ 2335735

[52] U.S. Cl. .......................... 317/100; 174/16 R; 317/101 DH

[51] Int. Cl.² .................................. H05K 7/20

[58] Field of Search ................. 310/68 D; 321/8 C; 174/15 R, 16 R; 317/100, 120, 117, 101 D, 101 DH, 101 CB; 200/5 R, 5 A; 235/145 R; 340/365 R

[56] References Cited

UNITED STATES PATENTS

| | | | |
|---|---|---|---|
| 2,893,137 | 7/1959 | Alling et al. | 317/101 D |
| 3,147,402 | 9/1964 | Hochstetler | 317/100 |
| 3,147,403 | 9/1964 | Cressman | 174/16 R |
| 3,166,636 | 1/1965 | Rutland et al. | 340/365 R |
| 3,609,464 | 9/1971 | Stone | 317/101 DH |
| 3,648,113 | 3/1972 | Rathjen | 317/100 |
| 3,755,630 | 8/1973 | Boyer | 317/120 |
| 3,780,798 | 12/1973 | Reimer | 317/100 |
| 3,790,859 | 2/1974 | Schraeder | 317/100 |

FOREIGN PATENTS OR APPLICATIONS

| | | | |
|---|---|---|---|
| 795,886 | 10/1968 | Canada | 317/100 |

*Primary Examiner*—Gerald P. Tolin
*Attorney, Agent, or Firm*—Max Fogiel

[57] ABSTRACT

An arrangement for processing and modifying copy material for remote-controlled typewriters, in which a box-shaped frame holds the electronic circuit boards. The frame is provided with guides into which the circuit boards are inserted in a manner whereby the guides are open on both sides and to the rear. When inserted into the guides the circuit boards are located one above the other. The rear wall of the frame is rotatable upwards and has a window spanning substantially all of the circuit boards. A blower is connected externally to the window on the rear wall, and another window is provided in the region of the corner of the frame lying diagonally opposite the window on the rear wall. Both windows are of substantially the same height.

11 Claims, 3 Drawing Figures

APPARATUS FOR HOLDING AND COOLING ELECTRONIC CIRCUIT BOARDS IN REMOTE-CONTROLLED TYPEWRITERS

BACKGROUND OF THE INVENTION

The present invention concerns a copy processing apparatus designed as an addition to remote-controlled electric typewriters, installed in a separate, box-form, housing.

Such equipments, which serve to store copy that has been typed on the keyboard of a typewriter, and type it out automatically in corrected or edited form, with additions and deletions, are known as so-called table-top equipments. In addition to a data memory, e.g., in the form of a magnetic tape memory, such equipments require a computer, commonly designed with integrated-circuit technology. Single building blocks of such a computer are available as encapsulated elements, which preferably can be mounted on so-called circuit boards. These circuits boards, which are made of insulating materials, carry at the same time the necessary connecting and interconnecting conductors in the form of "printed circuits."

Additional such circuit boards are required when, for the sake of immediate accessibility, at least a large part of the memory is in the form of semiconductor memories or similar. The latter is again, in the form of integrated-circuit technology. However, a compact, but easily-serviceable, installation of numerous circuit boards, which also have to be air-cooled, is difficult. Hence it was not previously possible to construct such equipments in table-top form, similar to that of the typewriter itself.

Accordingly, it is an object of the present invention to provide an apparatus of the foregoing species which is particularly useful by being compact and easily serviceable, and can hold many of the above-mentioned circuit boards.

Another object of the present invention is to provide an arrangement of the foregoing character which is simply in design and may be economically fabricated.

A still further object of the present invention is to provide an arrangement, as described, which is reliable in operation and may be readily maintained.

SUMMARY OF THE INVENTION

The objects of the present invention are achieved by providing an arrangement in which, the apparatus has a frame in the shape of a box, that accepts a number of circuit boards containing electronic components, inserted into guides that are on both sides and open to the rear, located one above the other. The rear wall of the frame can rotate upwards, and has a window, preferably spanning all circuit boards located one above the other, to which a blower duct is externally attached. An additional, equally high window is provided in the region of the corner of the frame lying diagonally opposite.

Because of the frame in the shape of a box, in combination with the two windows located diagonally opposite each other, the circuit boards which are installed in crowded arrangement in the frame, are excellently air-cooled. Yet the rear wall, rotatable upwards permits changing each one of these boards without the removal of any other parts.

The front wall of the frame, too, can consist of one or more circuit boards, inserted into similar guides that are open at the top.

It is particularly useful, in accordance with the present invention, to arrange the entire power supply of the apparatus next to the above-mentioned frame, thus allowing the duct to reach beyond the wall of the frame, so that at the same time the elements of the power supply are air-cooled. Here, the rectifiers as well as the power transistors of a possible voltage regulator, for the sake of an improved heat flow, can be mounted on a light-weight metal bracket, with at least a part of its cross-section exposed to the duct opening. At the front, the above-mentioned frame can have a low frontal protrusion that accepts the required operating buttons, and, if required, such circuit elements that need little cooling. The design of the housing of such an apparatus can be harmonized with that of a typewriter, particularly the connected one.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

DESCRIPTION OF THE PREFERRED EMBODIMENTS

Figure 3:
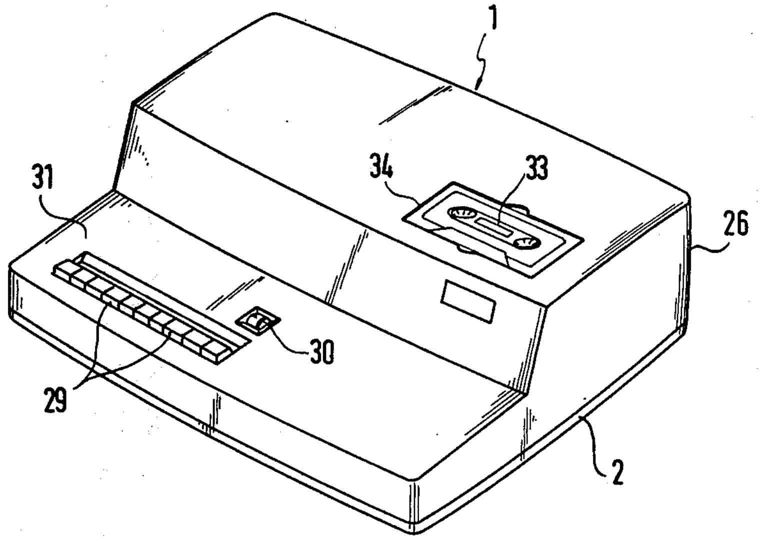
FIG. 3 shows an outside view of the same apparatus, together with a magnetic tape memory omitted in FIGS. 1 and 2.

Referring to the drawing, apparatus 1 is constructed as a table-top equipment. As can be seen particularly from FIG. 3, the apparatus has the shape of a typewriter, to which it is connected by a plug-in cable, not shown.

Figure 2:
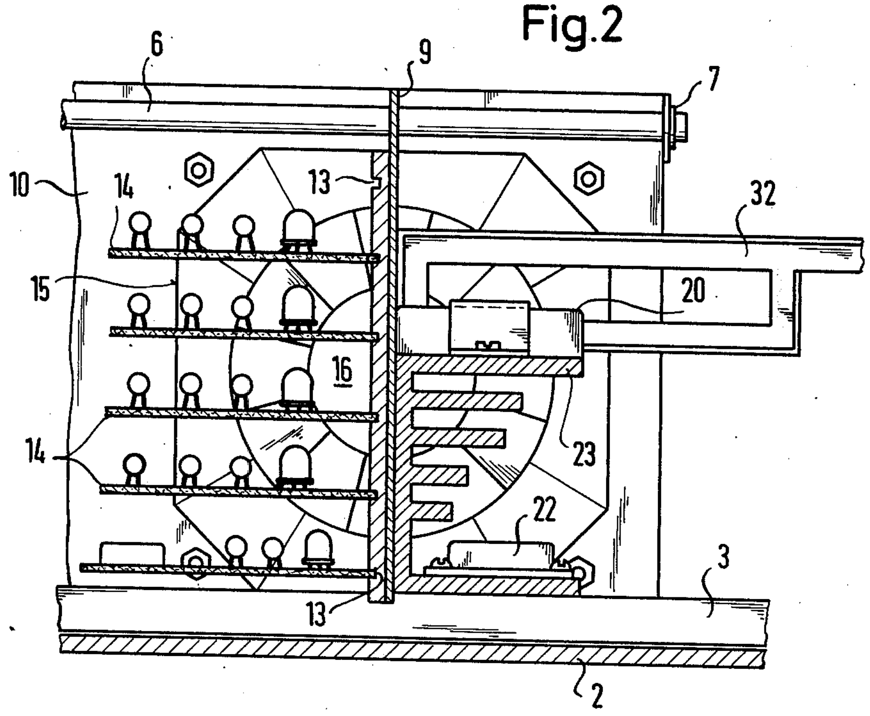
FIG. 2 shows a vertical partial section along the line II—II in FIG. 1.

A lower frame 3 is located in the rear portion of the lower part 2 of the housing, and the frame carries all the inner elements of the apparatus. Among these belongs particularly the frame 4, in the shape of a box, occupying somewhat more than half of the width of the housing. The frame 4 consists of two side plates 8 and 9, held apart at the top by rods 5 and 6 with spring rings 7, a rear wall 10, rotatable about rod 6, and a front wall formed by circuit board 11. Circuit board 11 is inserted from above into the vertical guides 12, located on both sides. Furthermore, plates 8 and 9 carry a number of parallel guides 13, located one over the other (visible on one side only), into which are inserted additional circuits boards 14 from the rear (see also FIG. 2).

The rear wall 10 extends laterally out beyond plate 9, and has a window 15 along substantially its entire height, lying half to the left and half to the right of plate 9. Around this window, in the rear, there is attached to rear wall 10 a blower duct 16, of a type common in the industry. Another window, of equal height, 17, is located at the front end of plate 8, so that it is substantially diagonally opposite to window 15. Duct 16 is able to such air through window 17. The air passes circuit boards 11, and, particularly, 14. Most of the circuit boards 14 serve, for example, for housing the building blocks of a semiconductor memory provided in apparatus 1. The control circuitry, and particularly the computer, on the other hand, are located on the lowest board 14 and/or board 11. Additional such boards can accept the control circuitry of possible peripheral equipment, such as, particularly, an additional magnetic tape memory.

At the right side of the figures, there is attached to frame 4 the power supply 18, with power transformer 19, semiconductor rectifier 20, and filter capacitors 21, associated with a voltage regulator having power transistors 22. The latter, as well as the rectifier 20, are mounted on a U-shaped, light-weight, laminated, metal bracket 23, the rear portion of which runs along plate 9. Thus a substantial part of its cross-section is exposed to window 15 and the duct 16 behind it. Thereby the bracket 23 obtains excellent cooling, favoring the flow of heat from rectifier 20 and transistors 22. Furthermore, the air stream caused by duct 16 passes the remainder of the power supply components, for which purpose there are air intake openings 24 in the frontal area of the lower part 2 of the housing.

Additional air intake openings 25 are located next to window 17 of the upper part 26 of the housing, which also has openings 27 behind duct 16.

Frame 4 has a low front protruding part 28 that carries particularly the operating buttons 29 of the apparatus. The buttons are preferably arranged next to each other in a single row, insofar as these are not located on the connected typewriter, as well as possible additional circuit elements and/or indicators, as for example, 30. As can be seen from FIG. 3, these appear, together with buttons 29, on the console 31 of the closed apparatus, which corresponds in its design to that of the keyboard of the connected typewriter. Furthermore, the front part 28 can contain electronic circuit elements requiring no special cooling.

Figure 1:
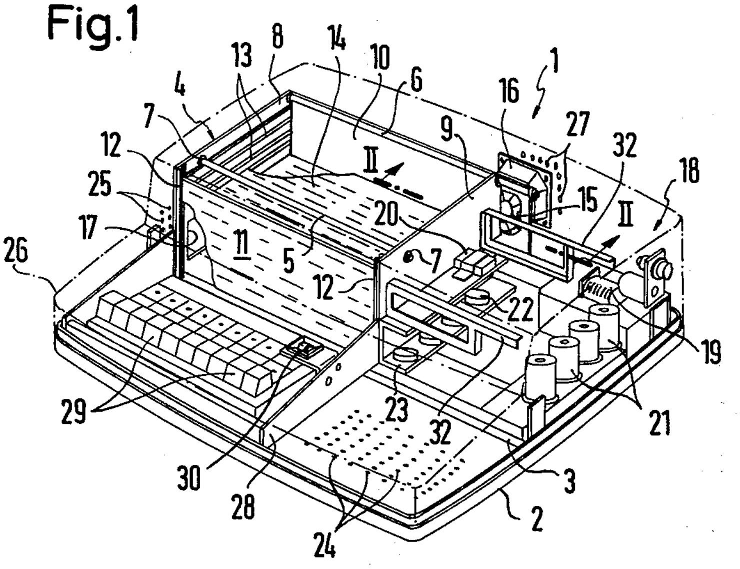
FIG. 1 is a view in perspective of the lower part of the housing with the inner elements of the apparatus according to the invention, and with the rest of the housing indicated by dashed lines.

Above the power supply 18, there can be inserted a compact tape memory, as already known in the art. This is not shown in FIGS. 1 and 2, in order to provide improved visualization. Supports 32 are provided on plate 9 for holding that memory. This equipment, too, is cooled by the air stream of duct 16. The tape cassette 33 of this equipment, too, is cooled by the air stream of duct 16. The tape cassette 33 of this equipment appears at window 34 of the upper part of the housing 26, so that the cassette can be changed at any time.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. An arrangement for processing copy for remote-controlled typewriters, comprising, in combination, a box-shaped frame holding circuit boards having electronic components; a plurality of guides on said frame supporting said circuit boards, said circuit boards being located one above the other; means for rotating about a horizontal axis of the rear wall of said frame; a first window on said rear wall and spanning substantially said circuit boards located one above the other; blower means connected externally to said first window; and a second window in the region of said frame lying diagonally opposite said first window, said second window being substantially as high as said first window, said blower means directing cooling air along a path free from passing through said circuit boards, said path being free of substantially sharp flow deflections; said cooling air contacting substantially the entire surfaces of said circuit boards, said first and second windows being located also adjacent to one pair of diagonally opposite corners of each circuit board.

2. The arrangement as defined in claim 1 wherein the frontal wall of said frame comprises at least one auxiliary circuit board, said auxiliary circuit board being held by guides on said frame; said guides holding said auxiliary circuit board having openings at the top for receiving said auxiliary circuit board.

3. The arrangement as defined in claim 1 including power supply means adjacent one side of said frame, said blowing means being located substantially in proximity to said side of said frame.

4. The arrangement as defined in claim 1 including housing means surrounding said frame and having air entrance and air exit openings.

5. An arrangement for processing copy for remote-controlled typewriters, comprising, in combination, a box-shaped frame holding circuit boards having electronic components; a plurality of guides on said frame supporting said circuit boards, said circuit boards being located one above the other; means for rotating about a horizontal axis the rear wall of said frame; a first window on said rear wall and spanning substantially said circuit boards located one above the other; blower means connected externally to said first window; and a second window in the region of said frame lying diagonally opposite said first window, said second window being substantially as high as said first window, said blower means directing cooling air along a path free from passing through said circuit boards, said path being free of substantially sharp flow deflections, said frame having a frontal member carrying operating push buttons.

6. The arrangement as defined in claim 5 wherein said operating push buttons are mounted on a frontal keyboard.

7. The arrangement as defined in claim 6 including housing means surrounding said frame and having a predetermined profile, the respective typewriter operating in conjunction with said arrangement having a profile similar to the profile of said housing means.

8. An arrangement for processing copy for remote-controlled typewriters, comprising, in combination, a box-shaped frame holding circuit boards having electronic components; a plurality of guides on said frame supporting said circuit boards, said circuit boards being located one above the other; means for rotating about a horizontal axis the rear wall of said frame; a first window on said rear wall and spanning substantially said circuit boards located one above the other; blower means connected externally to said first window; and a second window in the region of said frame lying diagonally opposite said first window, said second window being substantially as high as said first window, said blower means directing cooling air along a path free from passing through said circuit boards, said path being free of substantially sharp flow deflections; power supply means adjacent one side of said frame, said blowing means being located substantially in proximity to said side of said frame; rectifying means and power transistors in said power supply means; and metallic rail means mounting at least a portion of the cross-sectional area of said rectifying means and said power transistors, said metallic rail means being in the path of said blowing means.

9. The arrangement as defined in claim 8 wherein said rail means comprises substantially U-shaped laminar means, the rear of said rail means facing said side of said frame.

10. The arrangement as defined in claim 8 wherein said rail means is comprises of light-weight metal.

11. An arrangement for processing copy for remote-controlled typewriters, comprising, in combination, a box-shaped frame holding circuit boards having electronic components; a plurality of guides on said frame supporting said circuit boards, said circuit boards being located one above the other; means for rotating about a horizontal axis the rear wall of said frame; a first window on said rear wall and spanning substantially said circuit boards located one above the other; blower means connected externally to said first window; and a second window in the region of said frame lying diagonally opposite said first window, said second window being substantially as high as said first window, said blower means directing cooling air along a path free from passing through said circuit boards, said path being free of substantially sharp flow deflections; power supply means adjacent one side of said frame, said blowing means being located substantially in proximity to said side of said frame, the frontal wall of said frame comprising at least one auxiliary circuit board, said auxiliary board being held by guides on said frame; said guides holding said auxiliary circuit board having openings at the top for receiving said auxiliary circuit board; rectifying means and power transistors in said power supply means; metallic rail means mounting at least a portion of the cross-sectional area of said rectifying means and said power transistors, said metallic rail means being in the path of said blowing means, said rail means comprising substantially U-shaped laminar means, the rear of said rail means facing said side of said frame; housing means surrounding said frame and having air entrance and air exit openings, said frame having a frontal member carrying operating push buttons mounted on a frontal keyboard, said housing means having a predetermined profile, the respective typewriter operating in conjunction with said arrangement having a profile similar to the profile of said housing means, said rail means comprising substantially light-weight metal.

* * * * *